US009146477B2

(12) United States Patent
Jansen et al.

(10) Patent No.: US 9,146,477 B2
(45) Date of Patent: Sep. 29, 2015

(54) LITHOGRAPHIC APPARATUS AND METHOD OF MODIFYING A BEAM OF RADIATION WITHIN A LITHOGRAPHIC APPARATUS

(75) Inventors: Bastiaan Stephanus Hendricus Jansen, Waalre (NL); Maria Johanna Agnes Rubingh, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1034 days.

(21) Appl. No.: 13/249,423

(22) Filed: Sep. 30, 2011

(65) Prior Publication Data

US 2012/0162620 A1 Jun. 28, 2012

Related U.S. Application Data

(60) Provisional application No. 61/426,830, filed on Dec. 23, 2010.

(51) Int. Cl.
*G03B 27/52* (2006.01)
*G03B 27/68* (2006.01)
*G03B 27/54* (2006.01)
*G03F 7/20* (2006.01)
*G03B 27/42* (2006.01)

(52) U.S. Cl.
CPC .................................. *G03F 7/70308* (2013.01)

(58) Field of Classification Search
CPC .............. G03F 7/70308; G03F 7/7055; G03F 7/70558; G03F 7/70575; G03F 7/70858; G03F 7/70883; G03F 7/70891
USPC ........... 355/30, 52, 53, 55, 67–71, 72–75, 77; 250/492.1, 492.2, 492.22, 493.1, 548; 430/5, 8, 22, 30, 311, 312, 321
See application file for complete search history.

(56) References Cited

U.S. PATENT DOCUMENTS 5,677,757 A * 10/1997 Taniguchi et al. ............... 355/71
5,883,704 A * 3/1999 Nishi et al. ...................... 355/67
(Continued)

FOREIGN PATENT DOCUMENTS

EP 0 823 662 A2 2/1998
EP 1 925 981 A2 5/2008
(Continued)

OTHER PUBLICATIONS

English-Language Abstract for Japanese Patent Publication No. 07-122469 A, published May 12, 1995; 1 page.
(Continued)

*Primary Examiner* — Christina Riddle
(74) *Attorney, Agent, or Firm* — Sterne, Kessler, Goldstein & Fox P.L.L.C

(57) ABSTRACT

A lithographic apparatus comprises a beam modifying apparatus mounted in the path of a beam of radiation. The beam modifying apparatus comprises a conduit configured to allow the flow of a fluid through it, the conduit being arranged such that, in use, the beam of radiation passes through the conduit and the fluid flowing through it. The beam modifying apparatus further comprises a heat exchanger in thermal communication with a portion of the conduit located upstream, having regard to the direction of the fluid flow, of the location at which the beam of radiation passes through the conduit.

13 Claims, 5 Drawing Sheets

(56) References Cited

U.S. PATENT DOCUMENTS

| | | | |
|---|---|---|---|
| 6,335,787 | B1 | 1/2002 | Nishi |
| 6,504,597 | B2 | 1/2003 | Schuster et al. |
| 6,603,530 | B1 | 8/2003 | Kohno |
| 6,731,371 | B1 * | 5/2004 | Shiraishi ............ 355/30 |
| 6,992,306 | B2 * | 1/2006 | Honda et al. ............ 250/492.2 |
| 7,068,352 | B2 | 6/2006 | Irie |
| 7,433,015 | B2 | 10/2008 | Mulkens et al. |
| 7,483,117 | B2 | 1/2009 | Hirukawa |
| 7,525,640 | B2 | 4/2009 | Jansen et al. |
| 7,692,766 | B2 | 4/2010 | Roux |
| 7,924,403 | B2 | 4/2011 | Liebregts et al. |
| 2001/0055099 | A1 * | 12/2001 | Akagawa et al. ............ 355/30 |
| 2002/0191166 | A1 * | 12/2002 | Hasegawa et al. ............ 355/53 |
| 2003/0235682 | A1 | 12/2003 | Sogard |
| 2004/0160583 | A1 * | 8/2004 | Hubertus Mulkens et al. . 355/30 |
| 2004/0207824 | A1 | 10/2004 | Lof et al. |
| 2005/0018269 | A1 | 1/2005 | Weiss et al. |
| 2005/0046813 | A1 * | 3/2005 | Streefkerk et al. ............ 355/30 |
| 2005/0179877 | A1 * | 8/2005 | Mulkens et al. ............ 355/30 |
| 2007/0103656 | A1 * | 5/2007 | Sogard ............ 355/30 |
| 2008/0106711 | A1 * | 5/2008 | Beierl et al. ............ 355/30 |
| 2009/0046260 | A1 | 2/2009 | Jansen |
| 2009/0122428 | A1 | 5/2009 | Phillips et al. |
| 2009/0122429 | A1 | 5/2009 | Watson et al. |
| 2010/0201958 | A1 | 8/2010 | Hauf et al. |
| 2011/0025992 | A1 | 2/2011 | Holderer et al. |
| 2012/0092631 | A1 | 4/2012 | Van Boxtel et al. |

FOREIGN PATENT DOCUMENTS

| | | |
|---|---|---|
| JP | 61-100929 A | 5/1986 |
| JP | 07-122469 A | 5/1995 |
| JP | 07-321016 A | 12/1995 |
| JP | 08-221261 A | 8/1996 |
| JP | 09-232213 A | 9/1997 |
| JP | 09-312256 A | 12/1997 |
| JP | 10-064790 A | 3/1998 |
| JP | 10-270323 A | 10/1998 |
| JP | 11-067651 A | 3/1999 |
| JP | 3006532 B2 | 2/2000 |
| JP | 2004-259786 A | 9/2004 |
| JP | 2005-012201 A | 1/2005 |
| JP | 2008-277822 A | 11/2008 |
| JP | 2009-071316 A | 4/2009 |
| JP | 2009-088551 A | 4/2009 |
| TW | 486610 B | 5/2002 |
| WO | WO 2004/051716 A1 | 6/2004 |

OTHER PUBLICATIONS

English-Language Abstract for Japanese Patent Publication No. 07-321016 A, published Dec. 8, 1995; 1 page.

English-Language Abstract for Japanese Patent Publication No. 08-221261 A, published Aug. 30, 1996; 1 page.

English-Language Abstract for Japanese Patent Publication No. 07-312256 A, published Dec. 2, 1997; 1 page.

English-Language Machine Translation of Detailed Description and Claims for Japanese Patent Publication No. 3006532 B2, published Feb. 7, 2000; 4 pages.

English-Language Abstract for Japanese Patent Publication No. 61-100929 A, published May 19, 1986; 1 page.

English-Language Abstract for Japanese Patent Publication No. 10-064790 A, published Mar. 6, 1998; 1 page.

English-Language Abstract for Japanese Patent Publication No. 10-270323 A, published Oct. 9, 1998; 1 page.

English-Language Abstract for Japanese Patent Publication No. 2004/051716 A1, published Jun. 17, 2004; 1 page.

* cited by examiner

LITHOGRAPHIC APPARATUS AND METHOD OF MODIFYING A BEAM OF RADIATION WITHIN A LITHOGRAPHIC APPARATUS

CROSS REFERENCE TO RELATED APPLICATIONS

This application claims the benefit under 35 U.S.C. §119 (e) to U.S. Provisional Patent Application No. 61/426,830, filed Dec. 23, 2010, which is incorporated by reference herein in its entirety.

FIELD

The present invention relates to a lithographic apparatus and a method of modifying a beam of radiation within a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

It is well-known in the art of lithography that the image of a mask pattern can be improved, and process windows enlarged, by appropriate choice of the angles at which the mask pattern is illuminated. In an apparatus having a Koehler illumination arrangement, the angular distribution of radiation illuminating the mask is determined by the intensity distribution in a pupil plane of the illumination system, which can be regarded as a secondary source. Illumination modes are commonly described by reference to the shape of the intensity distribution in the pupil plane. Conventional illumination, i.e., even illumination from all angles from 0 to a certain maximum angle, requires a uniform disk-shaped intensity distribution in the pupil plane. Other commonly-used intensity distributions are: annular, in which the intensity distribution in the pupil plane is in the shape of an annulus; dipole illumination, in which there are two poles in the pupil plane; and quadrupole illumination, in which there are four poles in the pupil plane. To create these illumination schemes, various methods have been proposed. For example, a zoom-axicon, that is a combination of a zoom lens and an axicon, can be used to create annular illumination with controllable inner and outer radii of the annulus. To create dipole and quadrupole type illumination modes, it has been proposed to use spatial filters, that is opaque plates with apertures where the poles are desired as well as arrangements using moveable bundles of optical fibers. Using spatial filters may be undesirable because the resulting loss of radiation reduces the throughput of the apparatus and hence increases its cost of ownership. Arrangements with bundles of optical fibers may be complex and inflexible. It has therefore been proposed to use a diffractive optical element (DOE) to form the desired intensity distribution in the pupil plane. The diffractive optical elements are made by etching different patterns into different parts of the surface of a quartz or $CaF_2$ substrate.

A known type of radiation which is used within lithographic apparatus is deep ultraviolet (DUV) radiation. DUV radiation may have a wavelength of between about 100 nm and 300 nm, e.g., about 248 nm, about 193 nm, about 157 nm or about 126 nm. The choice of materials from which lenses useable with DUV radiation can be made is quite limited and even the best materials have significant coefficients of absorption of this radiation. This means that the lenses in the projection system absorb energy during exposures and heat up, leading to changes in their shape, separation and refractive index which introduce aberrations into the projected image. Therefore, many lens systems are provided with one or more actuated lens elements whose shape, position and/or orientation in one or more degrees of freedom can be adjusted during or between exposures to compensate for lens heating effects. Similar problems may occur within lithographic apparatus which has a generally reflective optical system, for example a lithographic apparatus which uses extreme ultra violet (EUV) radiation. Within such systems, the radiation of the lithographic apparatus may be absorbed by reflectors (such a mirrors), which may cause them to heat up and deform, thereby reducing the imaging performance of the lithographic apparatus.

If an illumination mode, such as dipole, in which the energy of the beam is strongly localized in a pupil plane of the illumination system is used, then the energy of the beam will also be strongly localized in and near the pupil plane(s) of the projection system. Lens heating effects are more severe when such localized illumination modes are used because the temperature gradients in the lens elements affected are greater, leading to localized changes in shape and/or refractive index which cause large phase gradients in the beam. These effects are often not correctable by existing actuated lens elements. Similar effects can be caused by the use of a slit-shaped illumination field, as is common in a scanning lithographic apparatus.

SUMMARY

It is desirable to provide, for example, a lithographic apparatus and method for at least reducing or mitigating for the effects of non-uniform heating of elements of a lithographic apparatus when using a localized illumination mode. Furthermore, it is desirable to provide an alternative lithographic apparatus and method for obviating or mitigating one or more of the problems of the prior art, whether identified herein or elsewhere.

According to an aspect of the present invention, there is provided a lithographic apparatus comprising a beam modifying apparatus mounted in the path of a beam of radiation, the beam modifying apparatus comprising: a conduit configured to allow the flow of a fluid through it, the conduit being arranged such that, in use, the beam of radiation passes through the conduit and the fluid flowing through it, and a heat exchanger in thermal communication with a portion of the conduit located upstream, having regard to the direction of the fluid flow, of the location at which the beam of radiation passes through the conduit.

The fluid may have an optical property which changes as a function of its temperature.

The optical property may be the refractive index.

Substantially the entire cross-section of the beam may pass through the conduit.

The lithographic apparatus may further comprise a heat exchange control apparatus, the heat exchange control apparatus being configured to control the heat exchanger such that the heat exchanger can independently exchange heat with a plurality of conduit portions, wherein at least one of the conduit portions is spaced from one of the other conduit portions in a direction which is across the direction of the fluid flow.

At least one of the conduit portions may be spaced from the one of the other conduit portions in a direction which is generally perpendicular to the direction of the fluid flow.

The conduit may have a generally elongate cross-section.

The direction of the fluid flow may be substantially perpendicular to an optical axis of the beam of radiation.

The lithographic apparatus may be operable in a scan mode, and the direction of the fluid flow may be generally parallel to a scanning direction of the lithographic apparatus.

The lithographic apparatus may further comprise a fluid providing apparatus, which is configured to provide the fluid to the conduit, the fluid providing apparatus and conduit being configured such that the fluid flow through the conduit is substantially laminar.

The lithographic apparatus may be an immersion lithography apparatus, the conduit may be defined at least in part by an immersion hood, and the fluid which is allowed to flow through the conduit may be an immersion fluid.

The lithographic apparatus may further comprise a radiation beam manipulator which is located substantially at a pupil plane of a projection system of the lithographic apparatus, the radiation beam manipulator being configured to manipulate a spatial frequency distribution of the radiation beam. The radiation beam manipulator may in addition or alternatively manipulate a wavefront of the radiation beam.

According to another aspect of the present invention, there is provided a method of modifying a beam of radiation within a lithographic apparatus, the lithographic apparatus comprising a beam modifying apparatus, the beam modifying apparatus comprising a conduit, a heat exchanger and a heat exchanger control apparatus, the method comprising: providing a beam of radiation, providing a fluid such that it flows through the conduit, the fluid having an optical property which changes as a function of its temperature, mounting the beam modifying apparatus in the path of the beam of radiation such that the beam of radiation passes through the conduit and the fluid flowing through it, and placing the heat exchanger in thermal communication with a portion of the conduit located upstream, having regard to the direction of the fluid flow, of the location at which the beam of radiation passes through the conduit, and using the heat exchanger control apparatus to control the heat exchanger such that it exchanges heat with the fluid, thereby modifying the beam of radiation by changing the optical property of the fluid through which the beam of radiation passes.

The heat exchanger control arrangement may be used to modify the beam of radiation to correct for aberrations caused by the heating of an optical component of the lithographic apparatus or cold aberrations caused by at least part of the lithographic apparatus.

The optical property of the fluid which changes as a function of the temperature of the fluid may be the refractive index.

According to a further aspect of the present invention there is provided a lithographic apparatus comprising: an optical element for interacting with a beam of radiation, the beam of radiation defining an optical area, and a beam modifying apparatus, wherein the beam modifying apparatus comprises a heating apparatus mounted to a movable member which may move relative to the optical element between a first position in which the heating apparatus is outside of the optical area and a second position in which the heating apparatus is within the optical area, and wherein the heating apparatus is configured to heat the optical element when the movable member is in the second position.

The heating apparatus may be configured to heat a first extent of the optical element when the movable member is in the second position, and the movable member may be moveable relative to the optical element to a third position in which the heating apparatus is configured to heat a second extent of the optical element.

The movable member may be configured such that in moving between the second and third positions, the heating apparatus passes over the optical element.

The lithographic apparatus may be operable in a scan mode. The movable member may be a patterning device support structure or a substrate table, and the relative movement between the first position and the second position may be a translation.

The heating apparatus may comprise a plurality of independent heat sources which are positioned across an axis which is perpendicular to the direction of movement between the first and second positions.

According to a still further aspect of the present invention, there is provided a method of modifying a beam of radiation within a lithographic apparatus, the lithographic apparatus comprising an optical element for interacting with the beam of radiation, the beam of radiation defining an optical area, and a beam modifying apparatus, the beam modifying apparatus comprising a heating apparatus mounted to a movable member, the method comprising: moving the movable member relative to the optical element between a first position in which the heating apparatus is outside of the optical area and a second position in which the heating apparatus is within the optical area, powering the heating apparatus when the movable member is in the second position to thereby heat the optical element.

The beam modifying apparatus may be used to modify the beam of radiation to correct for aberrations caused by the heating of a second optical component of the lithographic apparatus or cold aberrations caused by at least part of the lithographic apparatus.

The lithographic apparatus may have a projecting state in which a substrate is exposed to the radiation beam and a intermission state, and wherein the lithographic apparatus is in the intermission state when the movable member is moved between the first position and the second position and when the heating apparatus heats the optical element.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE
DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
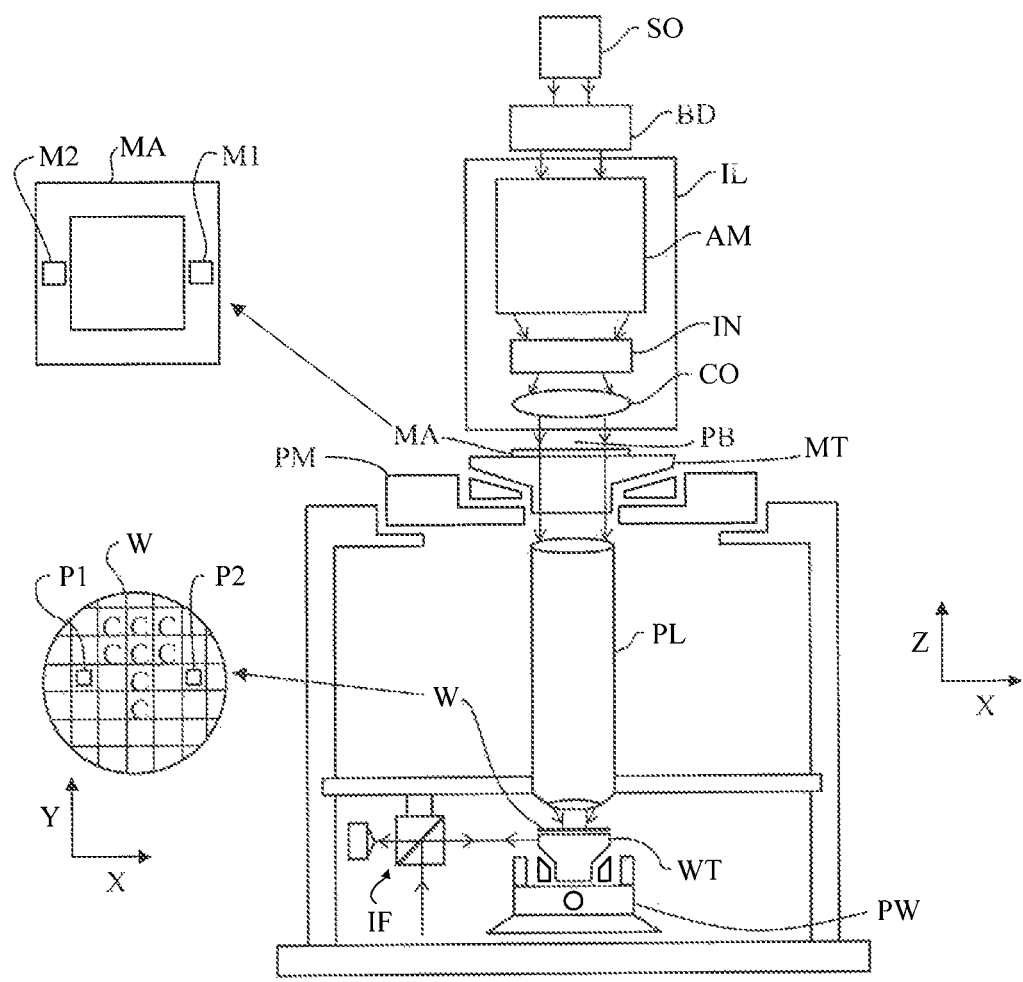
FIG. 1 depicts a lithographic apparatus.

FIGS. 8, 9, 10, and 11 depict a heating apparatus which may form part of a lithographic apparatus according to a further embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic apparatus according to a particular embodiment of the present invention. The apparatus comprises an illumination system (illuminator) IL to condition a beam PB of radiation (e.g., UV radiation or DUV radiation), a support structure (e.g., a support structure) MT to support a patterning device (e.g., a mask) MA and connected to first positioning device PM to accurately position the patterning device with respect to item PL, a substrate table (e.g., a wafer table) WT for holding a substrate (e.g., a resist coated wafer) W and connected to second positioning device PW for accurately positioning the substrate with respect to item PL, and a projection system (e.g., a refractive projection lens) PL configured to image a pattern imparted to the radiation beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as □-outer and □-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The support structure and the substrate table may move in a direction which is parallel to a direction y.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Reduction of non-uniform lens heating include the provision of additional radiation sources, e.g., infra-red, to heat the "cold" part, i.e., the part not traversed by the intense part of the beam, of elements of the projection system. See, for example, Japanese patent application publication JP-A-08-221261, which is incorporated herein by reference in its entirety, which addresses non-uniform heating caused by zonal or modified illumination. The provision of such additional radiation sources and guides to conduct the additional heat radiation to the correct place increases the complexity of the apparatus and the increased heat load in the projection system necessitates the provision of a cooling system of higher capacity.

Another proposal to deal with non-uniform heating caused by a slit-shaped illumination field is disclosed in U.S. Pat. No. 6,603,530, which is incorporated herein by reference in its entirety, which describes a special "lens illumination mark" provided in the reticle stage outside of the reticle area which diverges radiation so that the illumination of the lens elements in the projection system is rotationally symmetric. The lens elements are thermally saturated by illumination through the special mark before production exposures so that the non-rotationally symmetric heating caused by a slit-shaped illumination system does not cause non-rotationally symmetric aberrations.

The problem of non-uniform lens heating caused by localized illumination modes is addressed in WO 2004/051716, which is incorporated herein by reference in its entirety. In one proposal described in this document, "dummy irradiation" is performed during wafer exchange to heat the cold parts of the lens elements affected by non-uniform heating in production exposures. During the dummy irradiation, the illumination mode is set, using a diffractive optical element or an adjustable diaphragm, to be the inverse of the illumination mode used for production exposures so that the heating effects of the dummy irradiation are the inverse of the heating effects of production exposures and the net heating is more uniform. Another proposal of this document is to use additional infra-red radiation to locally heat selected lens elements.

Figure 2:
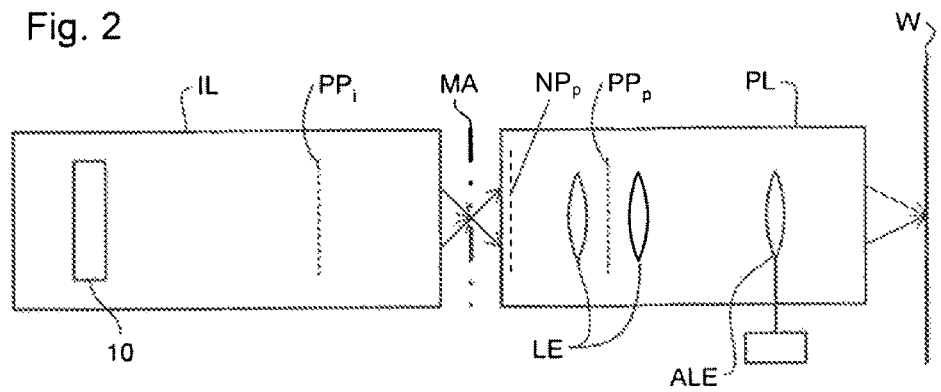
FIG. 2 depicts the optical arrangement of part of the apparatus of FIG. 1.

FIG. 2 depicts the basic optical arrangement of the apparatus of FIG. 1. It uses Koehler illumination wherein a pupil plane $PP_i$ in the illumination system IL is a Fourier transform plane of the object plane in which the patterning device MA is located and is conjugate to a pupil plane $PP_p$ of the projection system PL. As is conventional, an illumination mode of this apparatus can be described by reference to the distribution of intensity of the radiation of the beam B in the pupil plane $PP_i$ of the illumination system. It will be understood that the distribution of intensity in the pupil plane $PP_p$ of the projection system PL will be the same as the distribution of intensity in the pupil plane $PP_i$ of the illumination system, subject to diffraction effects of the pattern present in patterning device MA. A diffractive optical element (or other optical element) 10 is provided to form the illumination mode.

For a pattern consisting essentially of lines in one direction, good imaging and a large process window can be obtained by the use of dipole illumination in which the poles are arranged such that in the pupil plane $PP_p$ of the projection system, one of the first order diffracted beams deriving from each of the two poles in the illumination system coincides with the zeroth order beam deriving from the other pole. The other first order beams and higher order beams are not captured by the projection system. Dipole illumination is an example of an illumination mode. The lithographic apparatus may have a radiation beam manipulator which can manipulate the spatial frequency distribution (i.e., the intensity distribution in a pupil plane) and/or the intensity distribution (i.e., in a field plane) of the radiation beam to produce different illumination modes. Different illumination modes may be used depending on the structure of the pattern which is to be projected on to the substrate. It will be appreciated that the present invention described below may be utilised in conjunction with any appropriate illumination mode (i.e., not just a dipole illumination mode).

Figure 3:
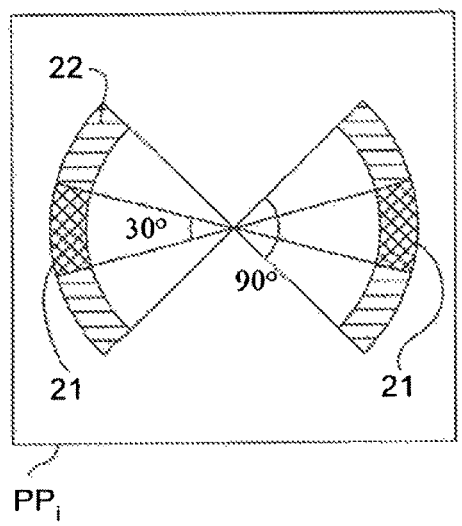
FIG. 3 depicts an illumination mode of the lithographic apparatus of FIG. 1.

A commonly used form of dipole is shown in FIG. 3. The poles 21 take the form of segments of an annulus subtending, as an example, an angle of 30°. This intensity distribution is convenient as it provides good imaging and is easy to create using a diffractive optical element and a zoom axicon. However, such an intensity distribution may give rise to aberrations caused by non-uniform heating of optical elements (e.g., lenses) LE in the projection system PL that are not correctable by a known adjustable optical element (e.g., lens) ALE. These optical elements LE may be located near to a field plane or near to a pupil plane of the lithographic apparatus, although the optical elements LE may be located at any appropriate position within the beam path of the radiation beam of the lithographic apparatus. Heating effects caused by an intensity distribution comprising dipoles 22, that are again annular but subtend a larger angle, e.g., 90 deg. (see FIG. 3), are acceptable or correctable by a known adjustable optical element ALE. In other respects however, such an intensity distribution provides inferior imaging performance as a larger proportion of the first diffraction orders fall outside the pupil, leading to lower image contrast.

Figure 4:
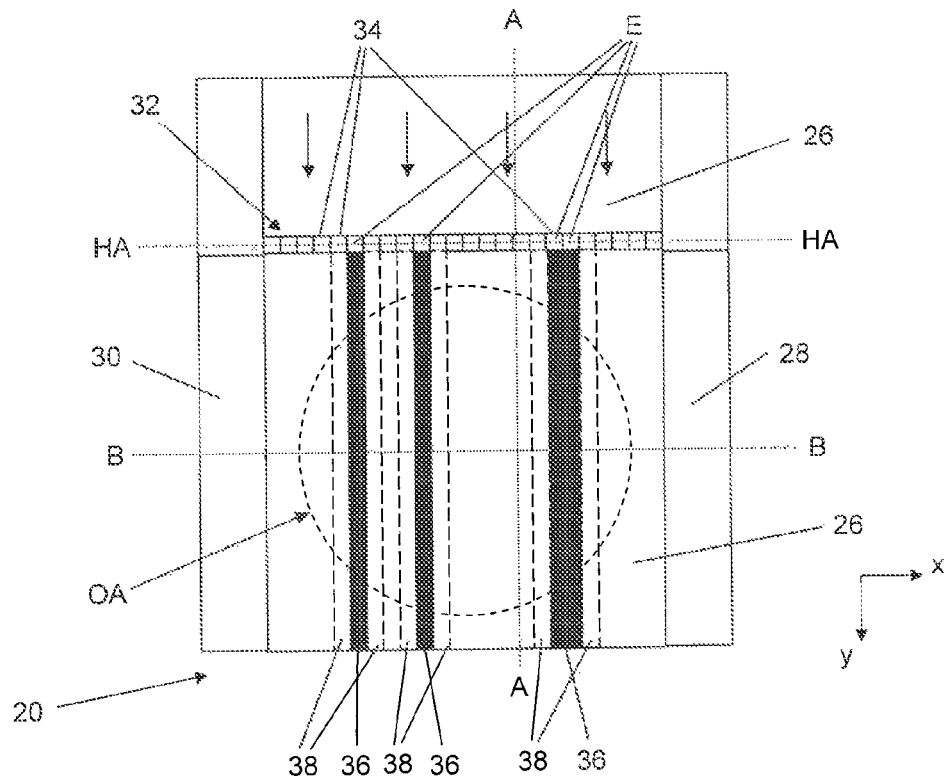
FIG. 4 depicts a plan view of a beam modifying apparatus which may form part of a lithographic apparatus according to an embodiment of the present invention.
Figure 5:
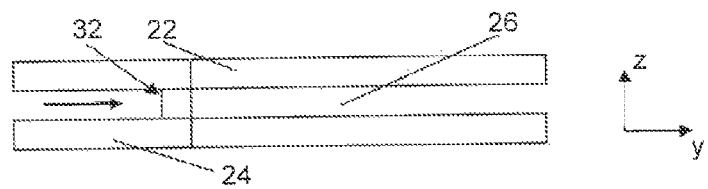
FIG. 5 depicts a cross-sectional view through the beam modifying, apparatus shown in FIG. 4 along axis A-A.
Figure 6:
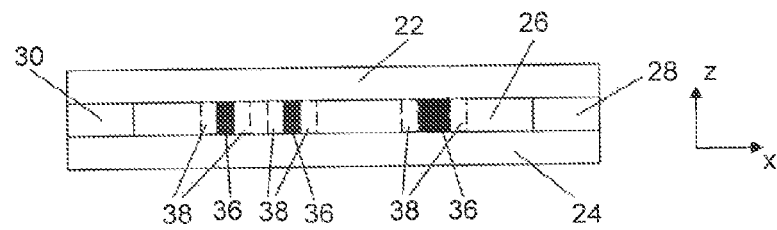
FIG. 6 depicts a cross-sectional view through the beam modifying apparatus shown in FIG. 4 along axis B-B.

FIGS. 4 to 6 show a beam modifying apparatus 20 which forms part of a lithographic apparatus according to the present invention. The beam modifying apparatus 20 may be located at any appropriate position along the beam path of the radiation beam within the lithographic apparatus. For example, the beam modifying apparatus 20 may be located in a plane which is not a pupil plane of the lithographic apparatus. For instance, the beam modifying apparatus 20 may be located in a plane which is near to a field plane of the lithographic apparatus. Such a plane may be referred to as a near-field plane. An example of a near field plane at which the beam modifying apparatus may be located is shown schematically in FIG. 2 and is indicated be $NP_p$. In this case, the beam modifying apparatus is located within the projection system PL of a lithographic apparatus at a near field plane $NP_p$ which is at a location upstream of a pupil plane $PP_p$ of the lithographic apparatus (having regard to the direction of travel of the beam of radiation).

The beam modifying apparatus 20 shown in FIGS. 4 to 6 is mounted within the lithographic apparatus such that it is substantially perpendicular to the optical axis of the beam of radiation. In this case, the optical axis of the beam of radiation lies in a direction Z which is substantially perpendicular to the plane of FIG. 4.

The beam modifying apparatus 20 comprises first and second wall members, 22, 24. The first and second wall members 22, 24 of the present embodiment are generally planar and are mounted relative to one another such that they lie substantially parallel to one another and define a conduit 26 between them. The first and second wall members 22, 24 are formed from a material which allows at least some of the radiation beam of the lithographic apparatus to pass through it.

The conduit 26 is not only defined by the first and second wall members 22, 24, but also by side wall members 28, 30. The beam modifying apparatus 20 is connected to a fluid providing apparatus (not shown) such that the fluid providing apparatus provides fluid to the conduit 26. In this embodiment, the fluid providing apparatus and conduit 26 are configured such that the flow of fluid through the conduit is substantially laminar. Due to the fact that the flow of the fluid through the conduit 26 is laminar, it means that the fluid flows in substantially parallel layers through the conduit 26. In this case, the fluid flows in parallel layers which travel substantially in the direction Y and are spaced from one another in the direction X.

The fluid providing apparatus provides fluid to the conduit 26 such that it passes through the conduit 26 (in a direction indicated by the arrows) from the portion of the conduit shown in the top of FIG. 4 to the portion of the conduit shown in the bottom of FIG. 4. The conduit 26 has a generally elongate cross-section perpendicular to the direction of the fluid flow through the conduit. In the illustrated embodiment, the longitudinal axis of the cross-section of the conduit perpendicular to the direction of fluid flow through the conduit 26 runs parallel to the x direction.

A heat exchanger 32 is located in thermal communication with a portion of the conduit 26. In this case, the heat exchanger 32 is contained, at least in part, within the conduit 26. The heat exchanger may be a heater such that it can increase the temperature of the fluid within the conduit 26. The heat exchanger may be a cooler, such that it can decrease the temperature of the fluid flowing through the conduit 26. In some embodiments, the heat exchanger may be a combination of a heater and a cooler. The heat exchanger 32 is arranged along an axis HA which is substantially parallel to the direction X and substantially perpendicular to the direction of the fluid flow (direction Y), such that the heat exchanger 32 extends across the conduit 26 in a direction which is across the direction of fluid flow (direction Y).

The beam modifying apparatus 20 is mounted in the path of the radiation beam of the lithographic apparatus such that, in use, the beam of radiation passes through the conduit 26 and the fluid flowing through it. In particular, the radiation beam passes first through the first wall member 22, then through the fluid flowing within the conduit 26, and then through the second wall member 24. Referring to FIG. 4, the beam passes through an area of the beam modifying apparatus 20 which is indicated by the circular region OA. The region of the beam modifying apparatus 20 through which the beam of radiation of the lithographic apparatus passes may be referred to as the optical area of the beam. The illustrated beam modifying apparatus 20 and the lithographic apparatus of which the beam modifying apparatus forms part are configured such that substantially the entire optical area (or cross-section) of the beam passes through the conduit 26. It will be appreciated that although the optical area of the beam of radiation, as described, is generally circular in shape. The optical area may be any appropriate shape and may be dependent on the configuration of the beam of radiation and the position and orientation of the beam modifying device as part of the lithographic apparatus.

The heat exchanger 32 is located such that the heat exchanger 32 is in thermal communication with a portion of the conduit 26 which is located upstream (having regard to the direction of the fluid flow (direction Y)) of the region OA via which the beam of radiation passes through the beam modifying apparatus 20 (and hence the conduit 26).

In the illustrated embodiment, the heat exchanger 32 is a heater. By energizing the heater 32 (which is located upstream of the portion of the conduit through which the beam of radiation passes) it is possible to heat the fluid within the conduit such that the fluid which has been heated by the heater flows downstream and passes through the portion of the conduit through which the beam of radiation passes.

In order to maximize the amount of heat that the fluid maintains while travel through the conduit 26 (i.e., in order to minimize heat loss and therefore temperature decrease of the fluid as it flows through the conduit downstream of the heater 32) it may be preferable in some embodiments for the first and second members 22, 24 which define the conduit 26 to be formed from a material which has low thermal conductivity. In this way, the amount of heat which is transferred from the heated fluid to the walls which define the conduit (e.g., first wall member 22 and second wall member 24) is minimized.

The fluid which flows through the conduit 26 may be any appropriate liquid or gas. The fluid has an optical property which changes as a function of its temperature. In some embodiments the optical property of the fluid which changes as a function of the temperature of the fluid is the fluid's refractive index. The heater 32 can be used to change the temperature of the fluid flowing through the conduit 26 and into the path of the beam of radiation which passes through the beam modifying apparatus 20. By changing the temperature of the fluid flowing through the conduit 26 and into the path of the beam of radiation of the lithographic apparatus, it is possible to change the refractive index of the fluid through which the beam of radiation passes. Changing the refractive index of the fluid through which the beam of radiation passes enables the path length and/or phase of at least part of the beam of radiation which passes through the beam modifying apparatus 20 to be changed.

In an embodiment where the beam modifying apparatus 20 is mounted within the lithographic apparatus such that it is in a plane which is near to the field plane, by modifying the path length and/or phase of the beam of radiation which passes through the beam modifying apparatus 20 it is possible to use the beam modifying apparatus 20 to correct for field effects (i.e., effects which affect the properties of the beam of radiation in a field plane, such as the plane in which the substrate is located within the lithographic apparatus). Field effects may include the effect of lens heating (as previously discussed) and/or the effects of cold lens aberrations. Cold lens aberrations are aberrations in the image formed in a field plane of the lithographic apparatus which are due to inherent imperfections in the lithographic apparatus itself (i.e., not due to lens heating). The beam modifying apparatus may also be used to tune the wavefront of the beam of radiation of the lithographic apparatus so as to enhance the image formed by the lithographic apparatus in the field plane (i.e., the plane at which the substrate is located).

In an embodiment where the beam modifying apparatus 20 is mounted within the lithographic apparatus such that it is in a plane which is near to the pupil plane, by modifying the path length and/or phase of the beam of radiation which passes through the beam modifying apparatus 20 it is possible to use the beam modifying apparatus 20 to correct for pupil effects (i.e., effects which affect the properties of the beam of radiation in a pupil plane, and hence in a corresponding field plane (such as the plane in which the substrate is located within the lithographic apparatus)). Pupil effects may include the effect of lens heating (as previously discussed) and/or the effects of cold lens aberrations. Cold lens aberrations in this case are aberrations in the intensity distribution of the beam of radiation in the pupil plane of the lithographic apparatus which are due to inherent imperfections in the lithographic apparatus itself (i.e., not due to lens heating).

The fluid which flows through the conduit may be any appropriate fluid, provided that it has an optical property which changes as a function of temperature (in the present embodiment the optical property is the refractive index) and provided that it will allow at least a portion of the radiation beam of the lithographic apparatus to pass through it. Examples of suitable fluids which change their refractive index as a function of their temperature include: water, air (which has preferably been cleaned and dried), nitrogen and helium.

Within the embodiment shown in FIGS. 4-6 the heat exchanger 32 (in this case a heater) has a plurality of heater elements 34, each of which can independently exchange heat with a different portion of the conduit 26. In particular, because the heater elements 34 of the heater 32 are arranged along the axis HA which is perpendicular to the direction of flow of the fluid through the conduit (Y direction), each of the conduit portions which are heated by their respective heater elements 24 are consequently also arranged along the axis HA. It follows that each of the conduit portions which is heated by its corresponding heater element 34 is spaced from the other conduit portions along the axis HA. The axis HA is substantially perpendicular to the direction of flow (direction Y) of the fluid flowing through the conduit 26. The axis HA can also extend across the direction of the fluid flow. As previously discussed, the flow of the fluid through the conduit is substantially laminar. Because of this, and because of the fact the heater elements 34 of the heater 32 are spaced from one another in a direction which is across the direction of the fluid flow, each heater element can be the to heat a separate parallel layer of the laminar fluid.

Due to the fact that the flow of the fluid through the conduit 26 is substantially laminar, by heating a portion of the conduit 26 using one of the heater elements 34 the portion of the fluid flowing through the conduit 26 which passes that heater element 34 will be heated (i.e., undergo an increase in temperature) and that heated portion of the fluid will travel downstream through the conduit in the direction of the fluid flow. As previously mentioned, because the fluid flow through the conduit 26 is laminar, the fluid flowing through the conduit 26 may be thought of as flowing as a number of parallel flowing portions which substantially do not interact with one another. As a result, if a portion of the fluid flowing through the conduit is heated by a heater element it will flow downstream through the conduit in the direction of fluid flow and will substantially not interact with fluid flowing through other portions of the conduit 26.

FIGS. 4 and 6 illustrate a heat exchanger (a heater in this case) which is controlled by a heat exchange control apparatus (not shown). The heat exchange control apparatus is configured to control the heat exchanger such that each of the heater elements 34 can be energized individually and hence each of the conduit portions which exchange heat with their respective heater element 34 can be heated individually. Referring to FIG. 4, the heater elements 34 which are indicated by E are energized. It can be seen that by energizing the heater element E, the portions of the fluid flowing through the conduit 26 and indicated by 36 are heated. The heated portions of the fluid 36 are coloured black within the figure in order to aid clarity. However, it will be appreciated that in the case of this embodiment, there will be substantially no change in the colour of the fluid or any decrease in the radiation absorption properties of the fluid as a function of the temperature of the fluid. It can be seen that the heated portions of the fluid pass through the region OA of the conduit 26 of the beam modifying apparatus 20 through which the beam of radiation passes. Due to the fact that the refractive index of the fluid changes as a function of the temperature of the fluid, it will be appreciated that the portions 36 of the fluid flowing through the conduit 26 will be at a different refractive index to those portions of the fluid flowing through the conduit which have not been heated by a heater element 34 of the heater 32.

The portions of the fluid which are adjacent the portions of the fluid within the conduit 26 which are heated by the energized heating elements E are indicated by dashed lines and are labelled 38. Depending on the properties of the fluid flowing through the conduit 26 (in particular, the thermal conductivity of the fluid) these adjacent regions 38 may be heated by the conduction of heat from a respective heated portion of the fluid 36 to the adjacent portion 38. In this case, the adjacent portions 38 of the fluid flowing through the conduit 26 may be at a temperature which is intermediate that of the heated portions 36 of the fluid and the remainder of the fluid (i.e., the portions of the fluid other than the heated portions 36 and intermediate portions 38). The intermediate temperature of the adjacent portions 38 of the fluid will hence result in the adjacent portions 38 having a refractive index which is intermediate that of the heated portions 36 of the fluid and the remainder of the fluid flowing through the conduit.

By using the heat exchange control apparatus to control each of the heater elements 34 of the heater 32 it is possible to independently control the temperature of separate portions of the fluid flowing through the conduit 26. These separate portions of the fluid flowing through the conduit are spaced across the direction of fluid flow. The heater elements 34 of the heater 32 may be energized to a different extent such that they heat their respective portions of the fluid flow through the conduit to different extents, thereby causing separate portions of the fluid flowing through the conduit to be at different temperatures. If separate portions of fluid flowing through the conduit are at different temperatures, then they will have a different refractive index. By controlling the extent to which each heater element 34 is energized (if at all) and also by taking into account the existence of adjacent heated regions 38, it is possible to control the temperature profile of the fluid across the conduit 26 (i.e., in a direction which is perpendicular to the fluid flow direction). By controlling the temperature profile of the fluid across the conduit 26 it is possible to control the refractive index profile of the fluid across the conduit 26. It will be appreciated that in embodiments where the optical property of the fluid which is temperature dependent is an optical property other than the refractive index, it will be the profile of this optical property which may be controlled by the heater element 34 of the heater 32 of the beam modifying apparatus 20. By controlling the profile of the optical property of the fluid across the conduit it is possible to control the optical property of individual portions of the fluid (spaced across the direction of fluid flow) through which individual portions of the beam of radiation passes. It follows that controlling each of the heater elements enables properties of the beam of radiation passing through the beam modifying apparatus to be controlled, as previously discussed.

The embodiment shown in FIGS. 4 to 6 has a heat exchanger 32 which can independently exchange heat with a plurality of conduit portions. This is because, in this case, the heat exchanger 32 is a heater with independently controllable heater elements 34. These heater elements 34 are arranged along an axis HA which extends across the conduit 26 and is substantially perpendicular to the direction of flow (direction Y) of the fluid through the conduit 26. It will be appreciated that the heat exchanger of other embodiments may be different. For example, the heat exchanger may independently exchange heat with a plurality of conduit portions which do not all lie on an axis which is substantially perpendicular to the direction of flow of the fluid. The heat exchanger may independently exchange heat with conduit portions which are generally located upstream or downstream relative one another having regard to the direction of bulk fluid flow through the conduit. Preferably the heat exchanger is such that the conduit portions with which it can independently exchange heat are spaced from one another in a direction which is across the direction of the fluid flow. That is to say that the plurality of conduit portions each carry a separate laminar layer of the laminar fluid flowing through the conduit.

It will also be appreciated that, in some embodiments of the present invention, the heat exchanger may be controlled by a heat exchange control apparatus which is configured such that the heat exchanger can independently exchange heat with a plurality of conduit portions (which are spaced from one another in a direction which is across the direction of the fluid flow) in a time dependent manner. For example, the heat control apparatus may be configured to enable the heat exchanger to independently exchange heat with each of the conduit portions at different times or for different time periods. For example, the heat control apparatus may be configured to enable the heat exchanger to independently exchange heat with each of the conduit portions in a pulsed manner. Furthermore, the heat control apparatus may be configured to enable the heat exchanger to independently exchange different amounts of heat with each of the conduit portions.

Within the embodiment described above, the portions of the conduit with which the heat exchanger is in thermal communication with (i.e., the portions of the conduit which contain the heater elements), and the portion of the conduit through which the beam of radiation passes are both defined by the first and second wall members. This may be a disadvantage in some embodiments because the heat exchanger may exchange heat with the first and second wall members to the extent that they undergo mechanical deformation due to the change in temperature caused by the exchange of heat with the heat exchanger. In this situation, deformation of the first and second wall members at the position at which the beam of radiation passes through the conduit may occur. This may result in the creation of further aberrations within the optical system which may adversely affect the imaging performance of the lithographic apparatus. For this reason, it may be desirable in some embodiments to separate the portion of the conduit which is in thermal communication with the heat exchanger and the portion of the conduit through which the beam of radiation passes. For example, these portions of the conduit may be formed by separate wall members and/or may be formed from a different material having different thermal characteristics.

As previously discussed, some known lithographic apparatus may be of a type wherein the substrate is immersed in a fluid (e.g., a liquid) having a relatively high refractive index, e.g., water, so as to fill a space between the final element of the projection system and the substrate. Immersion techniques are well known in the art for increasing the numerical aperture of projection systems.

Figure 7:
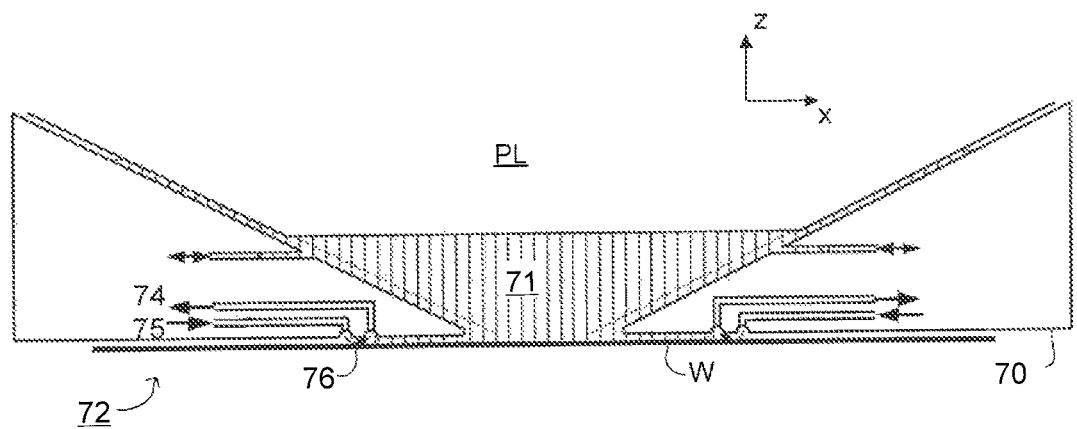
FIG. 7 depicts a cross-sectional view through an immersion hood which may form part of a lithographic apparatus according to another embodiment of the present invention.

An example of an immersion lithography arrangement with a localized fluid supply system is illustrated in FIG. 7. This arrangement provides the fluid supply system with a seal member (or so-called immersion hood) which extends along at least a part of a boundary of the space between the final element of the projection system PL and the substrate table or substrate W. The seal member is substantially stationary relative to the projection system PL in the XY plane though there may be some relative movement in the Z direction (in the direction of the optical axis). A seal is formed between the seal member 70 and the surface of the substrate W.

The seal member 70 forms a contactless seal to the substrate W around the image field of the projection system PL so that fluid (e.g., immersion fluid) is confined to fill a reservoir (or immersion space) 71 between the substrate surface and the final element of the projection system PL. The reservoir 71 is formed by a seal member 70 positioned below and surrounding the final element of the projection system PL. The immersion fluid is brought into the space below the projection system and within the seal member 70. The seal member 70 extends a little above the final element of the projection system PL and the liquid rises above the final element so that a buffer of liquid is provided. The seal member 70 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The immersion fluid is confined in the reservoir by a gas seal 76 between the bottom of the seal member 70 and the surface of the substrate W. The gas seal is formed by gas, e.g., air or synthetic air but, in an embodiment, $N_2$ or another inert gas, provided under pressure via inlet 75 to the gap between seal member 70 and substrate and extracted via first outlet 74. The overpressure on the gas inlet 75, vacuum level on the first outlet 74 and geometry of the gap are arranged so that there is a high-velocity gas flow inwards that confines the liquid. Such a system is disclosed in United States patent application publication no. US 2004-0207824, which is incorporated by reference herein in its entirety.

Other immersion lithography arrangements are possible and one or more embodiments of the present invention are equally applicable to those. For example, in place of the gas seal 76 it is possible to have a single phase extractor which only extracts liquid. Radially outwardly of such a single phase extractor could be one or more features to produce a gas flow to help contain the liquid in the space. One such type of feature might be a so-called gas knife in which a thin jet of gas is directed downwards onto the substrate W. During scanning motion of the substrate under the projection system and the liquid supply system, hydrostatic and hydrodynamic forces may be generated which result in pressures on the liquid downwards towards the substrate.

With a localized area liquid supply system, the substrate W is moved under the projection system PL and the liquid supply system. The relative movement of the table may be to enable an edge of the substrate W to be imaged, or for a sensor on the substrate table to be imaged for sensing purposes or for a substrate swap. Substrate swap is removal and replacement of the substrate W from the substrate table between exposures of different substrates, During substrate swap it may be desirable for the immersion fluid to be kept within the fluid confinement system 70. This is achieved by moving the fluid confinement system 70 relative to the substrate table, or vice versa, so that the fluid confinement system is placed over a surface of the substrate table away from the substrate W. Such a surface may be a shutter member. Immersion fluid may be retained in the fluid confinement system by operating the gas seal 76 or by clamping the surface of the shutter member to the undersurface of the fluid confinement system 70. The clamping may be achieved by controlling the flow and/or pressure of fluid provided to the undersurface of the fluid confinement system 70. For example, the pressure of gas supplied from the inlet 75 and/or the under pressure exerted from the first outlet 74 may be controlled.

The surface of substrate table over which the fluid confinement system 70 is placed may be an integral part of the substrate table 72 or it may be a detachable and or replaceable component of the substrate table 72. Such a detachable component may be referred to as closing disc or a dummy substrate. The detachable or separable component may be a separate stage. In a dual or multi stage arrangement the entire substrate table 72 is replaced during substrate exchange. In such an arrangement the detachable component may be transferred between substrate tables. The shutter member may be an intermediate table that may be moved adjacent to the substrate table prior to substrate exchange. The liquid confinement system may then be moved onto the intermediate table, or vice versa during substrate exchange. The shutter member may be a moveable component of the substrate table, such as a retractable bridge, which may be positioned between the stages during substrate exchange. The surface of the shutter member may be moved under the liquid confinement structure, or vice versa, during substrate exchange.

During substrate swap, an edge of the substrate W will pass under the immersion space 71 and fluid may leak into the gap between the substrate W and substrate table 72. This liquid may be forced in under hydrostatic or hydrodynamic pressure or the force of a gas knife or other gas flow creating device. A drain may be provided around the edge of a substrate W, such as in the gap. A drain may be located around another object on the substrate table. Such an object may include, but is not limited to, one or more sensors and/or a shutter member used to maintain fluid in the fluid supply system by being attached to the bottom of the fluid supply system during, for example, substrate swap. Thus, any reference to the substrate W should be considered to be synonymous with any such other object, including a sensor or shutter member, such as a closing plate.

Whereas the embodiment shown in FIGS. 4 to 6 had a beam modifying apparatus which was located in the projection system PL upstream (having regard to the direction of the beam of radiation) of a pupil plane of the lithographic apparatus, it will be appreciated that a beam modifying apparatus which forms part of the present invention may be located at any appropriate position within the lithographic apparatus. For example, FIG. 7 shows a portion of an immersion lithographic apparatus. A beam modifying apparatus which is similar to that which has been previously described may be located here as follows.

In the beam modifying apparatus shown in FIGS. 4 to 6, the conduit 26 through which the fluid which has an optical property that is dependent on its temperature flows is defined between first and second wall members 22, 24 and side members 28, 30. In FIG. 7 a conduit is defined between the final element of the projection system PL and the wafer W (or substrate), and by the seal member 70 (also referred to as an immersion hood). The conduit is referred to as the immersion space 71. The conduit (or immersion space) 71 may be filled with a fluid which changes its optical properties depending on its temperature. For example, the fluid within the conduit 71 may change its refractive index depending on its temperature. The fluid in the conduit 71 may or may not (depending on the particular embodiment) be an immersion fluid (i.e., a fluid which alters the numerical aperture of the projection system PL of the lithographic apparatus.

The conduit 71 may be configured such that fluid is provided to it by a fluid providing apparatus (not shown). The fluid providing apparatus and conduit 71 may be configured such that fluid flows through the conduit 71 in a substantially laminar manner. The fluid proving apparatus and conduit 71 may be configured such that the fluid within the conduit 71 flows in a direction which is perpendicular to the plane of the figure. The laminar flow of the fluid through the conduit 71 is indicated schematically within the figure by the parallel lines within the conduit 71 which indicate the presence of laminar layers within the fluid.

As for the previously described embodiment, a heat exchanger may be provided such that it is in thermal communication with a portion of the conduit located upstream (having regard to the direction of the fluid flow) of the location at which the beam of radiation of the lithographic apparatus passes through the conduit 71 so that it is incident on the wafer W (or substrate).

The heat exchanger used within this embodiment may be similar to that described in relation to the previous embodiment in that the heat exchanger may independently exchange heat with a plurality of conduit portions as previously discussed. It follows that an optical property of separate portions of the fluid within the conduit may be controlled independently and hence properties of the beam of radiation passing through the beam modifying apparatus can be controlled as previously discussed.

The beam modifying apparatus as shown in FIG. 7 may be used as an alternative to the beam modifying apparatus shown in FIGS. 4 to 6. However, in some lithographic apparatus, both the beam modifying apparatus shown in FIGS. 4 to 6 and the beam modifying apparatus shown in FIG. 7 may be used in conjunction with one another.

In common with both of the above described embodiments, the beam modifying apparatus which forms part of the present invention may be arranged such that the direction of fluid flow through the conduit is substantially perpendicular to an optical axis of the beam of radiation which passes through the beam modifying apparatus. This need not be the case in some embodiments. The beam modifying apparatus may be mounted in any appropriate orientation relative to the optical axis of the radiation and/or other feature of the lithographic apparatus (such as a scanning direction). It follows that the direction of the fluid flow through the conduit of the beam modifying apparatus may also be in any appropriate orientation relative to the optical axis of the radiation and/or other feature of the lithographic apparatus (such as a scanning direction).

The beam modifying apparatus may be mounted within a lithographic apparatus which is operable in a scan mode, such that the direction of fluid flow through the conduit is generally parallel to a scanning direction of the lithographic apparatus. The reason for this is as follows. Lithographic apparatus which is operable in a scan mode tends to have a generally slit-shaped radiation beam. This slit-shaped radiation beam is then scanned across both the patterning device and the substrate. The slit shaped radiation beam intrinsically has a much greater dimension in one direction than it does in a second perpendicular direction. The beam of radiation of such a lithographic apparatus may be orientated such that the greater dimension of the slit-shaped radiation beam lies substantially perpendicular to the scanning direction of the lithographic apparatus. This is because the radiation beam of the lithographic apparatus does not require any substantial length parallel to the scanning direction of the lithographic apparatus because the beam of radiation can be considered to be given length in this direction due to the scanning of the lithographic apparatus. Due to the slit-shaped nature of the radiation beam of a lithographic apparatus that is operable in a scan mode, it will be appreciated that being able to modify properties of the radiation beam along its lesser dimension may be less useful than the ability to modify the properties of the radiation beam along its greater dimension. Furthermore, depending on the resolution to which individual portions of the fluid conduit of the beam modifying apparatus can be addressed by the heat exchanger, trying to address different portions of the conduit which are spaced along the lesser dimension of the slit-shaped beam of radiation may be impractical.

It will be appreciated that although the beam modifying apparatus described above which forms part of the present invention has a single conduit which through which fluid may flow in a first direction, other embodiments may comprise a plurality of conduits. For example, the beam modifying apparatus may have a plurality of conduits which extend substantially parallel to one another. In an alternative embodiment, the beam modifying apparatus may have a stack of at least two conduits, each of the conduits having fluid flowing through it in a different direction. The stack of conduits may be arranged within the lithographic apparatus such that the beam of radiation passes through all of the conduits (and hence the respective fluids flowing through each of them). In one example, the beam modifying apparatus may have a stack of two conduits, the flow direction of fluid through each of them being perpendicular to that of the other. Each of the conduits may have a heat exchanger which can independently exchange heat with a plurality of conduit portions, where the conduit portions are spaced from one another in a direction which is across the direction of the fluid flow (for example perpendicular to the direction of fluid flow). In this way, the two conduits may form an array of pseudo-pixels, the optical properties of at least some of which can be controlled independently. By creating an array of pseudo-pixels, this may provide more degrees of freedom and a greater degree of control over the optical properties of the beam modifying apparatus i.e., it may provide control of the optical properties of the beam modifying apparatus in two dimensions (as opposed to controlling the optical properties of the beam modifying apparatus in only one dimension as described in the previous embodiments).

In some embodiments, the beam modifying apparatus may be sized and shaped such that it can be retrofitted to existing lithographic apparatus. For example, the beam modifying apparatus may be sized and shaped such that it can replace an optical element which already forms part of a lithographic apparatus.

FIGS. 8 to 11 show a further beam modifying apparatus in accordance with the present invention. FIGS. 8 to 11 show a portion of a lithographic apparatus in accordance with the present invention. The lithographic apparatus produces a radiation beam PB (the optical area of which is shown by the dashed lines marked OA) which is incident on a patterning device MA which is held on a support structure MT. The radiation beam PB passes through the patterning device MA and then passes through a lens element LE of the projection system PL.

The lithographic apparatus can be operated in a scan mode whereby the support structure MT (and hence patterning device MA) translates relative to the lens element LE of the projection system PL in a direction which is substantially parallel to the direction Y.

The beam modifying apparatus has a heating apparatus 80 mounted to the support structure MT (which in this case constitutes a moveable member which may move relative to the lens element (optical element)). The support structure MT is moveable between a first position (shown in FIG. 8) in which the heating apparatus 80 is outside of the optical area OA of the beam of radiation PB; and a second position (shown in FIG. 9) wherein the heating apparatus 80 is within the optical area OA of the beam of radiation PB.

The heating apparatus 80 it configured such that it is capable of heating the lens element LE of the projection system PL when it is in the second position. Any appropriate heating apparatus may be used to heat the lens element LE of the projection system PL. In some embodiments, the heating apparatus may have a source of infrared radiation. For example, a heating apparatus of some embodiments may emit radiation which has a wavelength between about 0.1 µm and about 500 µm. In such an embodiment, it is preferable that the lens element LE is highly absorbent of infrared radiation because this will maximise the heating of the lens element LE due to the infrared radiation of the heating apparatus incident on it. For example, in the case where the lens element LE is formed from fused silica, infrared wavelengths around 2.8 µm and above about 4.5 µm are highly absorbed by the lens element LE. However, it should be noted that the reflection of infrared radiation by fused silica shows an increase for wavelengths of infrared radiation above about 8 µm. Reflected infrared radiation will not be absorbed by the lens element LE and hence will not contribute to heating the lens element LE. For this reason, infrared radiation with a wavelength of about 2.8 µm and between about 4.5 µm and about 8 µm are most suitable for heating a lens element formed from fused silica.

The infrared radiation source may be an infrared laser.

The lens element LE of the projection system PL may be a first lens element of a projection lens which forms part of the projection system PL of the lithographic apparatus. The first lens element of the projection lens is commonly defined as the lens element of the projection lens which is closest to the patterning device MA. The first lens element of the projection lens is located in an optical plane of the lithographic apparatus which is near to a field plane of the lithographic apparatus. It follows that by changing optical properties of the first lens element, it is possible to modify the radiation intensity distribution of the radiation beam of the lithographic apparatus in a field plane of the lithographic apparatus (i.e., the plane in which the substrate is located).

Figure 9:
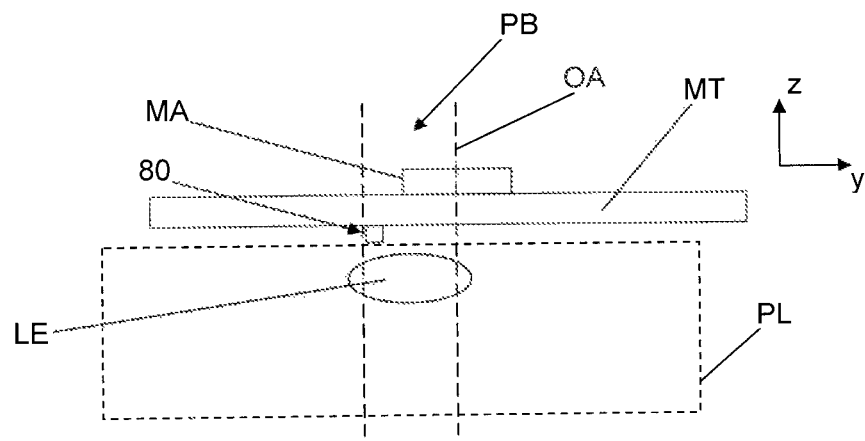
Figure 10:
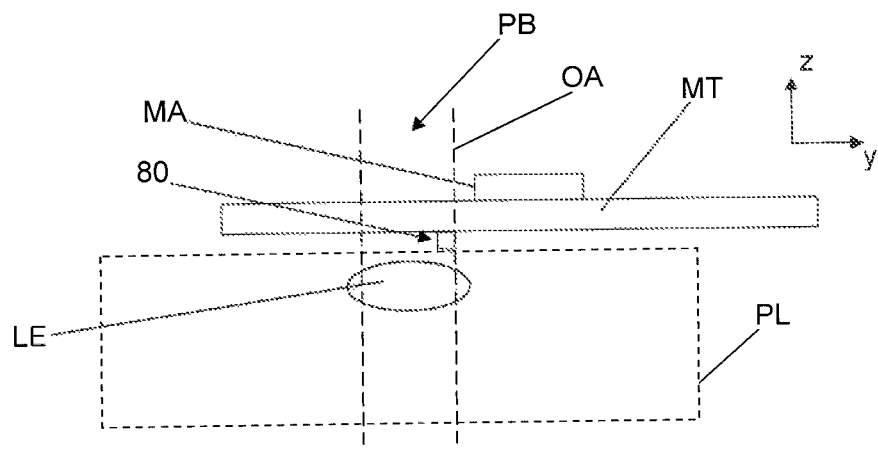

The use of the heating apparatus 80 to heat the lens element LE may change the properties of the lens element. For example, optical properties of the lens element may be changed. The lens element LE may be formed from a material which changes its refractive index as a function of temperature. Furthermore, the shape of the lens element LE may be changed by temperature dependent expansion or contraction of the material from which the lens element is formed. Changing the shape of the lens element LE will also change the optical properties of the lens element LE. As previously discussed, FIG. 9 shows the support structure MT in a second position in which the heating apparatus 80 is within the optical area of the beam of radiation PB. In the second position the heating apparatus 80 may heat the lens element LE, and in particular the heating apparatus 80 may heat a first extent of the lens element LE. Within FIG. 9, the first extent of the lens element LE is the portion of the lens element which is to the left (having regard to the orientation of the figure). FIG. 10 shows the moveable member (support structure) MT in a third position in which the heating apparatus 80 is configured to heat a second extent of the optical element. Within FIG. 10 the second extent of the lens element LE is the portion of the lens element LE which is to the right (having regard to the orientation of the figure). While the moveable support structure MT moves between the second position and the third position, it will be appreciated that the heating apparatus 80 will pass over the lens element LE such that substantially any portion of the lens element LE may be heated by the heating apparatus 80. By energizing the heating apparatus While it is at different positions over a lens element LE it is possible to selectively heat (and therefore selectively change optical properties of) particular portions of the lens element.

It will be appreciated that although the optical element of the projection system PL in this embodiment is an optical lens element, any appropriate optical element may be heated by the heating apparatus 80 of the beam modifying apparatus. For example, the optical element may be a mirror. The projection system and/or the lithographic apparatus of which it forms part may be a generally reflective system (for example, where the radiation of the lithographic apparatus is extreme ultraviolet (EUV) radiation), a generally transmissive system (as described above) or a catadioptric system.

It will also be appreciated that although the beam modifying apparatus described has a heating apparatus 80 which is mounted to the moveable patterning device support structure, the heating apparatus may equally be mounted to the substrate table so that the heating apparatus can heat an optical element which is located within the projection system PL at a position near to the substrate table.

The moveable member (which may be the patterning device support structure, the substrate table or any other appropriate movable member, depending on the embodiment) may move between the first and second positions, and between the second and third positions, at any appropriate time. For example, the moveable member may move between the first and second position and/or between the second and third position between exposures of a substrate. The lithographic apparatus may be the to be in a projecting state at a time when a substrate is being exposed to the patterned beam of radiation and in an intermission state at a time when a substrate is not being exposed to a patterned beam of radiation.

Figure 8:
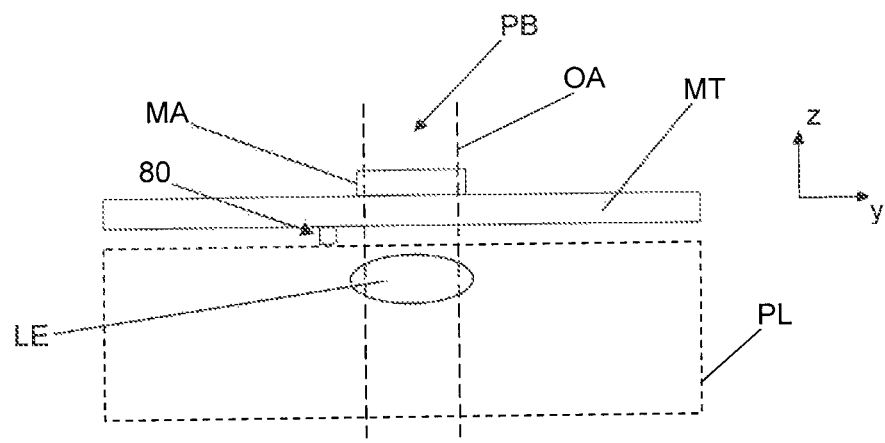
Figure 11:
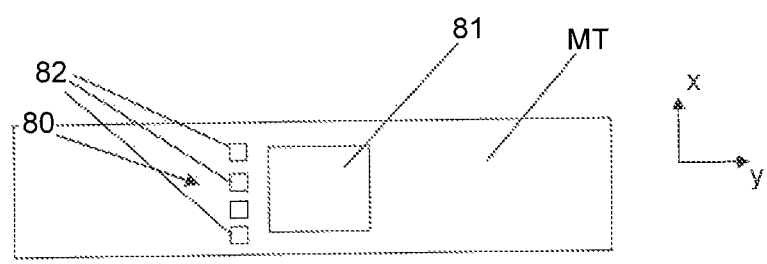

FIG. 11 shows a view of the support structure MT shown in FIGS. 8 to 10. FIG. 11 shows a view in a direction which is parallel to the optical axis of the radiation beam. The view faces the side of the support structure MT which is closest to the projection system PL. In this embodiment the heating apparatus 80 comprises four discrete heating elements 82. The heating elements constitute independent heat sources which can be energized independently by a heating control apparatus. It will be appreciated that the heating apparatus may have any number of independent heat sources and that the heat sources may have any appropriate relative position. Preferably, the independent heat sources are positioned such that they are spaced from one another in a direction which is the direction of movement between the second and third positions (and/or between the first and second positions). That is to say, the independent heat sources are positioned such that they can address different portions of the optical element as the movable member moves between the second and third positions (and/or between the first and second positions), where in the different portions of the optical element are spaced from one another in a direction which is substantially perpendicular to the direction moves between the second and third positions (and/or between the first and second positions).

The heat sources 82 are located adjacent a window 84 in the support structure MT which allows the passage of the radiation beam through it. It will be appreciated that in other embodiments, the heat sources may be mounted to any appropriate portion of the support structure MT. The heat sources 82 of the heating apparatus 80 are arranged along an axis which is substantially perpendicular to the scanning direction of the lithographic apparatus (direction Y as indicated in the figure). The scanning direction (Y direction) of the lithographic apparatus is the direction of movement between the first and second, and second and third positions of the moveable member (support structure MT). By energizing the heat sources 82 of the heating apparatus 80 independently, it is possible to selectively heat portions of the lens element LE which are spaced in an X direction (where the X direction is substantially orthogonal to the Y direction and the Z direction, the Z direction being substantially parallel to the optical axis of the radiation beam). It follows that by independently energizing the heat sources 82 of the heating apparatus 80 While they are located at a desired position over the lens element LE in the Y direction, it is possible to selectively heat a portion of the lens element which is discrete in both the X and Y directions. Hence, the heating apparatus 80 of the beam modifying apparatus can be used to change the optical properties of portions of the lens element LE which are discrete in both the X and Y directions.

In some embodiments, the optical element which is heated by the heating apparatus may also be cooled by a cooling fluid, or other suitable apparatus, such that there is a power equilibrium in relation to heat exchanged with the optical element, such that a stable temperature profile is created within the optical element.

In common with the first two embodiments described above, the beam modifying apparatus of this embodiment can be used to modify the beam of radiation to correct for aberrations in the in image formed at the substrate of the lithographic apparatus due to heating of another optical component within the lithographic apparatus due to the beam of radiation. The beam modifying apparatus may alternatively, or in addition, be used to modify the beam of radiation to correct for aberrations in the image produced by the lithographic apparatus at the substrate which are due to inherent imperfections in the optical system of the lithographic apparatus. Such aberrations may be referred to as cold aberrations.

It will be appreciated that in all of the described embodiments, the beam modifying apparatus may modify or control at least one optical property of the material that the beam of radiation passes through at a position along the beam path of the beam of radiation. The position along the beam path of the beam of radiation may not be at a pupil plane of lithographic apparatus. Altering a property of the radiation beam (by altering an optical property of the material it travels through) at a location which is not at a pupil plane of the lithographic apparatus allows field effects (discussed above) to be corrected for. Pupil effects may be corrected for separately in the pupil plane using a separate pupil effect correcting apparatus. The embodiments above enable the properties of the radiation beam at a location which is not at a pupil plane of the lithographic apparatus to be modified or controlled without placing an object in the path of the beam of radiation which will be imaged in a field plane of the lithographic apparatus (e.g., where the substrate is located). Creating an image in the field plane which is not that created by the patterning device may adversely affect the imaging performance of the lithographic apparatus (i.e., the ability of the lithographic apparatus to image the image created by the pattering device onto a substrate) and may therefore be undesirable.

In some embodiments, the beam modifying apparatus may be located at a position along the beam path of the beam of radiation which is substantially at a pupil plane of the lithographic apparatus.

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising a beam modifying apparatus mounted in the path of a beam of radiation, the beam modifying apparatus comprising:
   a conduit comprising:
      a first wall member, a second wall member, a first side wall member, and a second side wall member;
      wherein the first and second wall members are parallel to each other;
      wherein the first wall member is in contact with the first and the second side wall members and the second wall member is in contact with the first and the second side wall members; and
      wherein the conduit is configured to allow the flow of a fluid through the conduit, the conduit being arranged such that, in use, the beam of radiation passes through the first and second wall members of the conduit and the fluid flowing through the conduit; and
   a heat exchanger in thermal communication with a portion of the conduit located upstream, having regard to the direction of the fluid flow, of the location at which the beam of radiation passes through the conduit.

2. The lithographic apparatus of claim 1, wherein the fluid has an optical property which changes as a function of its temperature.

3. The lithographic apparatus of claim 2, wherein the optical property is refractive index.

4. The lithographic apparatus of claim 1, wherein substantially an entire cross-section of the beam passes through the conduit.

5. The lithographic apparatus of claim 1, further comprising a heat exchange control apparatus, the heat exchange control apparatus being configured to control the heat exchanger such that the heat exchanger independently exchanges heat with a plurality of conduit portions, wherein at least one of the conduit portions is spaced from one of the other conduit portions in a direction which is across the direction of the fluid flow.

6. The lithographic apparatus of claim 5, wherein the at least one of the conduit portions is spaced from the one of the other conduit portions in a direction which is generally perpendicular to the direction of the fluid flow.

7. The lithographic apparatus of claim 1, wherein the direction of the fluid flow is substantially perpendicular to an optical axis of the beam of radiation.

8. The lithographic apparatus of claim 1, wherein the lithographic apparatus is operable in a scan mode, and wherein the direction of the fluid flow is generally parallel to a scanning direction of the lithographic apparatus.

9. The lithographic apparatus of claim 1, wherein the lithographic apparatus further comprises a fluid providing apparatus, which is configured to provide the fluid to the conduit, the fluid providing apparatus and conduit being configured such that the fluid flow through the conduit is substantially laminar.

10. The lithographic apparatus of claim 1, wherein:
    the lithographic apparatus is an immersion lithography apparatus;
    the conduit is defined at least in part by an immersion hood; and
    the fluid which is allowed to flow through the conduit is an immersion fluid.

11. The lithographic apparatus of claim 1, wherein the lithographic apparatus further comprises a radiation beam manipulator which is located substantially at a pupil plane of a projection system of the lithographic apparatus, the radiation beam manipulator being configured to manipulate a spatial frequency distribution of the radiation beam.

12. The lithographic apparatus of claim 1, wherein the conduit has a substantially elongate cross-section perpendicular to the direction of the fluid flow through the conduit.

13. The lithographic apparatus of claim 1, wherein the first and second wall members are substantially planar.

* * * * *

UNITED STATES PATENT AND TRADEMARK OFFICE
CERTIFICATE OF CORRECTION

PATENT NO. : 9,146,477 B2
APPLICATION NO. : 13/249423
DATED : September 29, 2015
INVENTOR(S) : Jansen et al.

It is certified that error appears in the above-identified patent and that said Letters Patent is hereby corrected as shown below:

On the Title Page, Item (56), References Cited, under "OTHER PUBLICATION" section, after "English-Language Abstract for Japanese Patent Publication No." please delete "07-312256" and insert --09-312256--.

Signed and Sealed this
Twenty-first Day of June, 2016

Michelle K. Lee
*Director of the United States Patent and Trademark Office*